(12) United States Patent
Harada et al.

(10) Patent No.: US 6,582,880 B2
(45) Date of Patent: Jun. 24, 2003

(54) POLYMERS, RESIST COMPOSITIONS AND PATTERNING PROCESS

(75) Inventors: Yuji Harada, Kubiki-mura (JP); Jun Watanabe, Kubiki-mura (JP); Jun Hatakeyama, Kubiki-mura (JP); Yoshio Kawai, Kubiki-mura (JP); Masaru Sasago, Osaka (JP); Masayuki Endo, Osaka (JP); Shinji Kishimura, Itami (JP); Michitaka Ootani, Kawagoe (JP); Satoru Miyazawa, Kawagoe (JP); Kentaro Tsutsumi, Kawagoe (JP); Kazuhiko Maeda, Tokyo (JP)

(73) Assignees: Shin-Etsu Chemical Co., Ltd., Tokyo (JP); Matsushita Electric Industrial Co. Ltd., Osaka (JP); Central Glass Co., Ltd., Yamaguchi (JP)

( * ) Notice: Subject to any disclaimer, the term of this patent is extended or adjusted under 35 U.S.C. 154(b) by 0 days.

(21) Appl. No.: 09/947,765

(22) Filed: Sep. 7, 2001

(65) Prior Publication Data

US 2002/0051936 A1 May 2, 2002

(30) Foreign Application Priority Data

Sep. 7, 2000 (JP) .......................................... 2000-271205

(51) Int. Cl.$^7$ .......................... G03F 7/004; C08F 118/02

(52) U.S. Cl. .................. 430/270.1; 430/326; 430/907; 430/910; 526/242; 526/319; 526/320

(58) Field of Search ............................... 430/270.1, 326, 430/910, 907; 526/319, 242

(56) References Cited

U.S. PATENT DOCUMENTS 4,962,171 A * 10/1990 Osuch et al. ................ 526/266
6,358,665 B1 * 3/2002 Pawlowski et al. ...... 430/270.1

FOREIGN PATENT DOCUMENTS

| EP | 1103856 | * 5/2001 |
| JP | A 63-27829 | 2/1988 |
| JP | B 2-27660 | 6/1990 |
| JP | A 9-73173 | 3/1997 |
| JP | A 9-230595 | 9/1997 |
| JP | A 10-10739 | 1/1998 |
| WO | WO97/33198 | 9/1997 |

* cited by examiner

Primary Examiner—Rosemary Ashton
(74) Attorney, Agent, or Firm—Millen, White, Zelano & Branigan, P.C.

(57) ABSTRACT

An acrylate resin containing fluorinated alkyl groups in ester side chains has high transmittance to VUV radiation. A resist composition using the resin as a base polymer is sensitive to high-energy radiation, has excellent sensitivity and resolution, and is suited for lithographic microprocessing.

20 Claims, 1 Drawing Sheet

EXAMPLE 4

COMPARATIVE EXAMPLE 1

POLYMERS, RESIST COMPOSITIONS AND PATTERNING PROCESS

This invention relates to polymers useful as the base resin in chemical amplification resist compositions suited for microfabrication. It also relates to chemical amplification resist compositions comprising the polymers, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. To the demand for a resist material with a higher resolution and sensitivity, acid-catalyzed chemical amplification positive working resist materials are effective as disclosed in U.S. Pat. Nos. 4,491,628 and 5,310,619 (JP-B 2-27660 and JP-A 63-27829). They now become predominant resist materials especially adapted for deep UV lithography. Also, the change-over from i-line (365 nm) to shorter wavelength KrF laser (248 nm) brought about a significant innovation. Resist materials adapted for KrF excimer lasers enjoyed early use on the 0.3 micron process, went through the 0.25 micron rule, and currently entered the mass production phase on the 0.18 micron rule. Engineers have started investigation on the 0.15 micron rule, with the trend toward a finer pattern rule being accelerated.

For ArF laser (193 nm), it is expected to enable miniaturization of the design rule to 0.13 μm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ excimer laser (157 nm) which is expected to enable further miniaturization to 0.10 μm or less, more difficulty arises in insuring transparency because it was found that acrylic resins which are used as the base resin for ArF are not transmissive to light at all and those cycloolefin resins having carbonyl bonds have strong absorption. It was also found that poly(vinyl phenol) which is used as the base resin for KrF has a window for absorption in proximity to 160 nm, so the transmittance is somewhat improved, but far below the practical level.

SUMMARY OF THE INVENTION

An object of the invention is to provide a novel polymer having a high transmittance to vacuum ultraviolet radiation of up to 300 nm, especially $F_2$ excimer laser beam (157 nm), $Kr_2$ excimer laser beam (146 nm), KrAr excimer laser beam (134 nm) and $Ar_2$ excimer laser beam (126 nm), and useful as the base resin in a chemical amplification resist composition. Another object is to provide a chemical amplification resist composition comprising the polymer, and a patterning process using the same.

It has been found that using as the base polymer an acrylate resin containing fluorinated alkyl groups in ester side chains, a resist material featuring high transparency is obtained.

In a first aspect, the invention provides a polymer comprising recurring units of the following general formula (1).

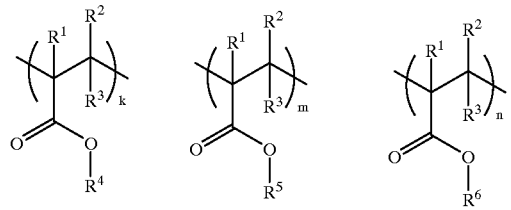

Herein $R^1$ to $R^3$ are independently selected from the group consisting of hydrogen, fluorine, and straight, branched or cyclic alkyl and fluorinated alkyl groups of 1 to 20 carbon atoms, $R^4$ is a monovalent fluorinated hydrocarbon group of 1 to 20 carbon atoms containing at least one fluorine atom, $R^5$ is an acid labile group, $R^6$ is an adhesive group, subscripts k, m and n are numbers satisfying $0<k+m+n \leq 1$. Preferably in formula (1), at least one of the units containing $R^4$ to $R^6$ has an alicyclic structure.

In a second aspect, the invention provides a resist composition comprising the polymer defined above.

Also provided is a chemically amplified, positive resist composition comprising (A) the polymer defined above, (B) an organic solvent, and (C) a photoacid generator. The resist composition may further include (D) a basic compound and/or (E) a dissolution inhibitor.

In a third aspect, the invention provides a process for forming a resist pattern comprising the steps of applying the resist composition onto a substrate to form a coating; heat treating the coating and then exposing it to high-energy radiation in a wavelength band of 110 to 180 nm or 1 to 30 nm through a photo mask; and optionally heat treating the exposed coating and developing it with a developer. Preferably, the high-energy radiation is an $F_2$ excimer laser beam, $Ar_2$ excimer laser beam or soft x-ray.

For improving the transmittance in proximity to 157 nm, reducing the number of carbonyl groups and/or carbon-to-carbon double bonds is contemplated to be one effective way. It was also found that introducing fluorine atoms into base polymers makes a great contribution to improved transmittance. In fact, poly(vinyl phenol) having fluorine introduced in its aromatic rings offers a transmittance nearly on a practically acceptable level. However, this base polymer was found to turn to be negative upon exposure to high-energy radiation as from an $F_2$ excimer laser, interfering with its use as a practical resist. In contrast, those polymers obtained by introducing fluorine into acrylic resins or polymers containing in their backbone an alicyclic compound originating from a norbornene derivative have been found to be suppressed in absorption and overcome the negative turning problem. Especially when fluorine is introduced into ester side chains as in the present invention, the transmittance in proximity to 157 nm is significantly improved.

DESCRIPTION OF THE PREFERRED EMBODIMENT

Polymer

Figure 1:
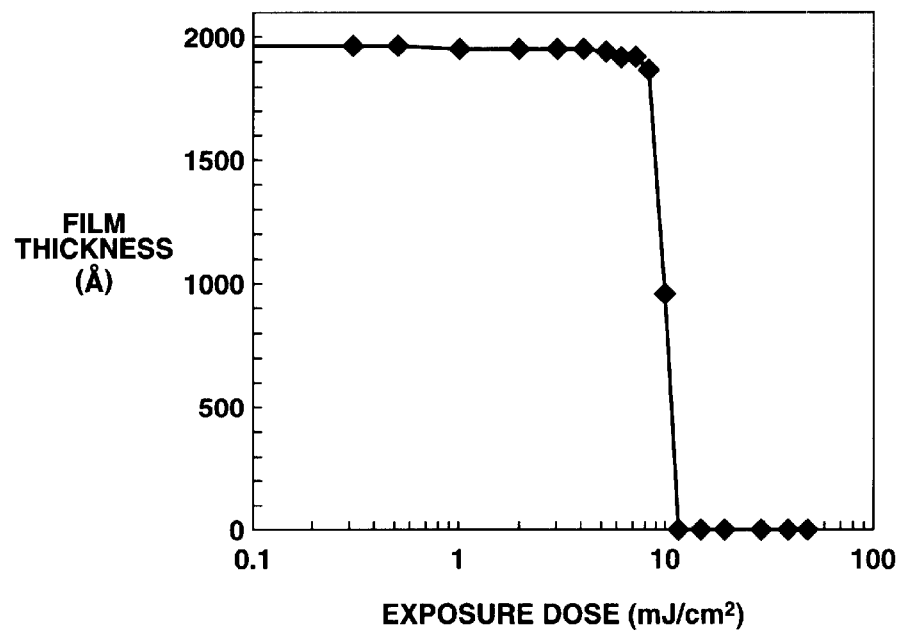
FIG. 1 is a graph showing film thickness versus exposure dose for the resist composition of Example 4.

According to the invention, the polymers or high molecular weight compounds are defined as comprising recurring structures of the following general formula (1).

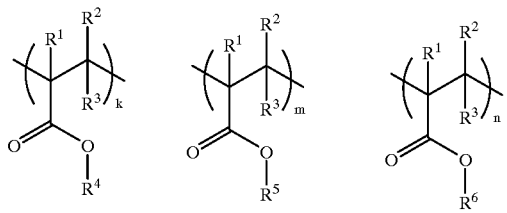
(1)

Herein each of $R^1$ to $R^3$ is a hydrogen atom, a fluorine atom, or a straight, branched or cyclic alkyl or fluorinated alkyl group of 1 to 20 carbon atoms, $R^4$ is a monovalent fluorinated hydrocarbon group of 1 to 20 carbon atoms containing at least one fluorine atom, $R^5$ is an acid labile group, $R^6$ is an adhesive group, subscripts k, m and n are numbers satisfying $0<k+m+n\leq 1$. In each unit, $R^1$ to $R^3$ are identical or different.

In formula (1), the straight, branched or cyclic alkyl groups represented by $R^1$ to $R^3$ are those of 1 to 20 carbon atoms, preferably of 1 to 12 carbon atoms, and especially of 1 to 10 carbon atoms, for example, methyl, ethyl, propyl, isopropyl, n-propyl, sec-butyl, tert-butyl, cyclopentyl, cyclohexyl, 2-ethylhexyl and n-octyl. The fluorinated alkyl groups correspond to the foregoing groups in which some or all of the hydrogen atoms are substituted with fluorine atoms, and include, for example, trifluoromethyl, 2,2,2-trifluoroethyl, 3,3,3-trifluoropropyl, and 1,1,2,2,3,3,3-heptafluoropropyl. Especially, $R^1$ is preferably methyl group or trifluoromethyl group.

$R^4$ stands for monovalent fluorinated hydrocarbon groups of 1 to 20 carbon atoms. Such fluorinated hydrocarbon groups correspond to unsubstituted monovalent hydrocarbon groups including straight, branched or cyclic alkyl groups (which are as exemplified above), aryl groups (e.g., phenyl, tolyl, xylyl and naphthyl), and aralkyl groups (e.g., benzyl, phenylethyl and phenylpropyl), in which some or all of the hydrogen atoms are substituted with fluorine atoms. Illustrative examples are given below.

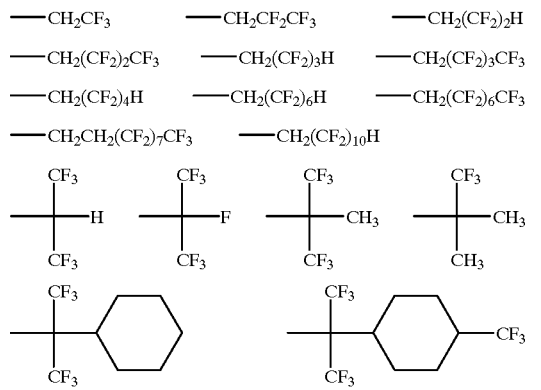

-continued

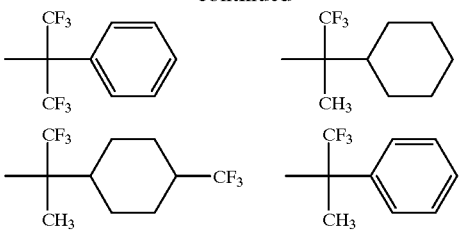

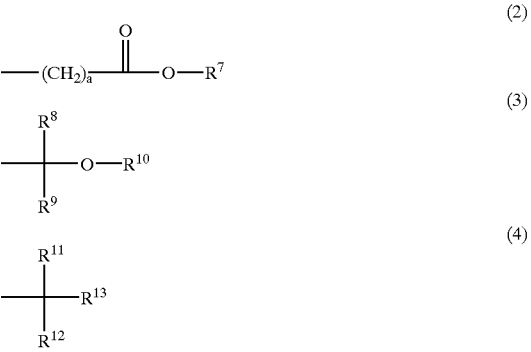

Especially, $R^4$ preferably has 3 to 9 fluorine atoms.

Next, the acid labile group in formula (1) is described. The acid labile group is selected from a variety of such groups, preferably from among the groups of the following formulae (2) to (4).

$$-(CH_2)_a-\overset{O}{\underset{\|}{C}}-O-R^7 \quad (2)$$

$$\begin{array}{c} R^8 \\ | \\ -C-O-R^{10} \\ | \\ R^9 \end{array} \quad (3)$$

$$\begin{array}{c} R^{11} \\ | \\ -C-R^{13} \\ | \\ R^{12} \end{array} \quad (4)$$

In the formulae, $R^7$ and $R^{10}$ each are a monovalent hydrocarbon group, such as a straight, branched or cyclic alkyl group of 1 to 20 carbon atoms; $R^8$ and $R^9$ each are hydrogen or a straight, branched or cyclic alkyl group of 1 to 20 carbon atoms; $R^{11}$ to $R^{13}$ each are a monovalent hydrocarbon group, such as a straight, branched or cyclic alkyl group of 1 to 20 carbon atoms in which some hydrogen atoms may be substituted with fluorine atoms; $R^7$ to $R^{13}$ may contain hetero atoms such as oxygen, sulfur, nitrogen or fluorine; a pair of $R^8$ and $R^9$, $R^8$ and $R^{10}$, $R^9$ and $R^{10}$, $R^{11}$ and $R^{12}$, $R^{11}$ and $R^{13}$, and $R^{12}$ and $R^{13}$, taken together, may form a ring; and "a" is an integer of 0 to 10.

Preferred examples of these formulae are described below.

In formula (2), $R^7$ is a tertiary alkyl group of 4 to 20 carbon atoms, preferably 4 to 15 carbon atoms. Illustrative examples of the acid labile groups of formula (3) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

In formula (3), $R^8$ and $R^9$ are hydrogen or straight, branched or cyclic alkyl groups of 1 to 18 carbon atoms, preferably 1 to 10 carbon atoms, for example, methyl, ethyl, n-propyl, isopropyl, n-butyl, sec-butyl, tert-butyl, cyclopentyl cyclohexyl, 2-ethylcyclohexyl and n-octyl. $R^{10}$ is a monovalent hydrocarbon group of 1 to 20 carbon atoms, preferably 1 to 10 carbon atoms, which may contain a hetero atom such as oxygen, for example, straight, branched or cyclic alkyl groups and substituted ones of these alkyl groups in which some hydrogen atoms are substituted with hydroxyl, alkoxy, oxo, amino or alkylamino groups. Illustrative examples of the group of formula (3) include cyclic groups such as tetrahydrofuran-2-yl, 2-methyltetrahydrofuran-2-yl, tetrahydropyran-2-yl, and 2-methyltetrahydropyran-2-yl as well as straight and branched groups which are shown below. Of these, ethoxyethyl, butoxyethyl and ethoxypropyl groups are preferred.

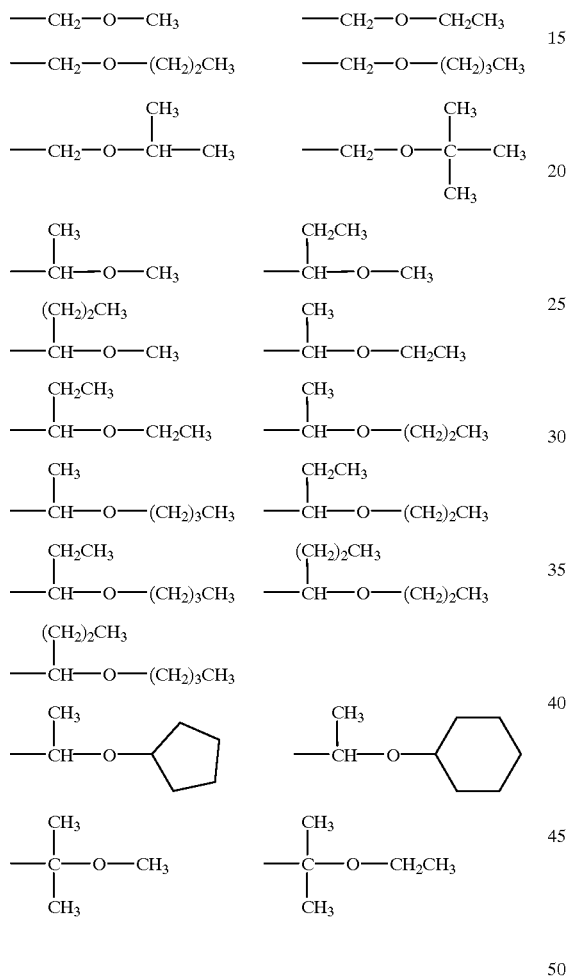

Exemplary tertiary alkyl groups of formula (4) are tert-butyl, triethylcarbyl, 1-ethylnorbornyl, 1-methylcyclohexyl, 1-ethylcyclopentyl, 2-(2-methyl)adamantyl, 2-(2-ethyl)adamantyl, tert-amyl, 1,1,1,3,3,3-hexafluoro-2-methyl-isopropyl, and 1,1,1,3,3,3-hexafluoro-2-cyclohexyl-isopropyl as well as groups of formulae (5) to (20) shown below.

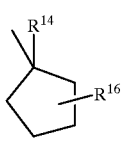 (5)

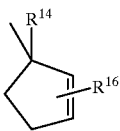 (6)

(7)

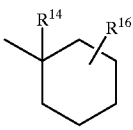 (8)

(9)

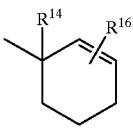 (10)

(11)

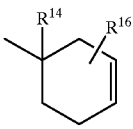 (12)

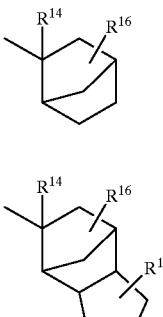

(13)

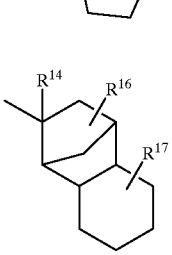

(14)

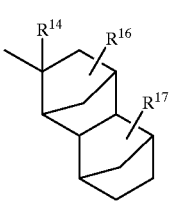

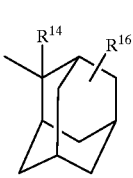

-continued

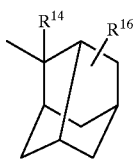

(15)

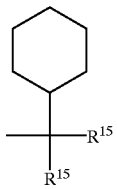

(16)

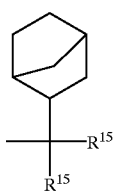

(17)

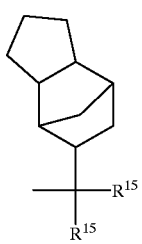

(18)

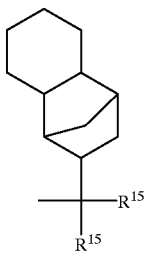

(19)

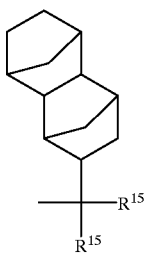

(20)

$R^{14}$ is a straight, branched or cyclic alkyl group of 1 to 6 carbon atoms, for example, methyl, ethyl, propyl, isopropyl, n-butyl, sec-butyl, n-pentyl, n-hexyl, cyclopropyl, cyclopropylmethyl, cyclobutyl, cyclopentyl and cyclohexyl. $R^{15}$ is a straight, branched or cyclic alkyl group of 2 to 6 carbon atoms, for example, ethyl, propyl, isopropyl, n-butyl, sec-butyl, n-pentyl, n-hexyl, cyclopropyl, cyclopropylmethyl, cyclobutyl, cyclopentyl and cyclohexyl. Each of $R^{16}$ and $R^{17}$ is hydrogen or a monovalent hydrocarbon group of 1 to 6 carbon atoms which may contain a hetero atom or a monovalent hydrocarbon group of 1 to 6 carbon atoms which may be separated by a hetero atom. The hetero atom is an oxygen, sulfur or nitrogen atom, which is contained or intervenes in the form of —OH, —OR, —O—, —S—, —S(=O)—, —NH$_2$, —NHR, —NR$_2$, —NH—, or —NR— wherein R is an alkyl group. Examples of $R^{16}$ and $R^{17}$ include hydrogen, alkyl, hydroxyalkyl, alkoxy, and alkoxyalkyl groups which may be straight, branched or cyclic. Illustrative are methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

Next, the adhesive group in formula (1) is described. The adhesive group is selected from a variety of such groups, preferably from among the substituent groups of the following formulae (21) through (49).

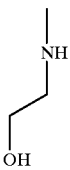

(21)

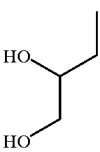

(22)

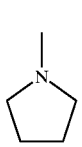

(23)

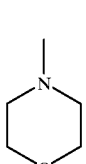

(24)

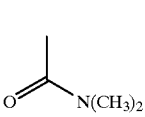

(25)

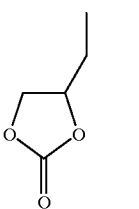

(26)

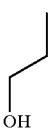

(27)

-continued
(28) 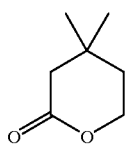
(29) 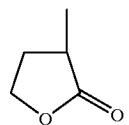
(30) 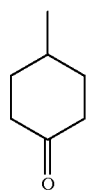
(31) 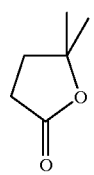
(32) 
(33) 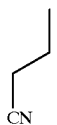
(34) 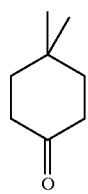
(35) 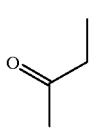
(36) 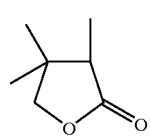
-continued
(37) 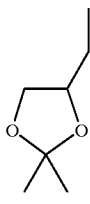
(38) 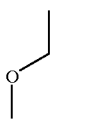
(39) 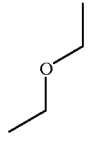
(40) 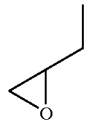
(41) 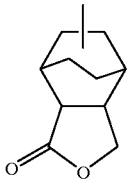
(42) 
(43) 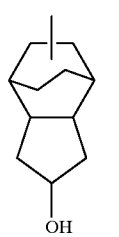
(44) 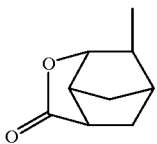

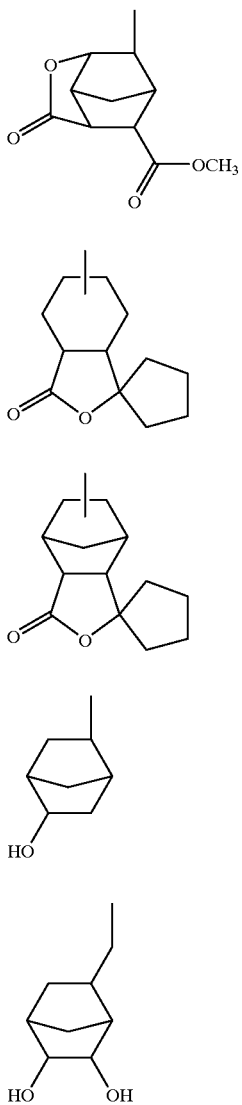

Preferably, in formula (1), at least one of the units containing $R^4$ to $R^6$ has an alicyclic structure. Especially, $R^5$ preferably has at least one alicyclic structure.

In formula (1), subscripts k, m and n are numbers satisfying $0<k+m+n \leq 1$, and preferably $k+m+n=1$. Preferably, k, m and n are positive numbers, k is in the range of 0.05 to 0.7, and more preferably 0.1 to 0.6, m is in the range of 0.1 to 0.7, and more preferably 0.1 to 0.5, and n is in the range of 0.01 to 0.5.

In some embodiments, the inventive polymer includes other units, the sum of the number of other units plus k, m and n being equal to 1.

Desirably the polymer has a weight average molecular weight of about 1,000 to about 1,000,000, and especially about 2,000 to about 100,000.

The polymer of the invention is generally synthesized by mixing monomers corresponding to the respective units in formula (1) with a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for polymerization the polymer of the invention are radical polymerization of triggering polymerization with radicals of α,α'-azobisisobutyronitrile (AIBN) or the like, and ion (anion) polymerization using catalysts such as alkyl lithium.

The radical polymerization initiator used herein is not critical. Exemplary initiators include azo compounds such as 2,2'-azobis(4-methoxy-2,4-dimethylvaleronitrile), 2,2'-azobis(2,4-dimethylvaleronitrile), 2,2-azobisisobutyronitrile, and 2,2'-azobis(2,4,4-trimethylpentane); and peroxide compounds such as t-butyl peroxypivalate, lauroyl peroxide, benzoyl peroxide and t-butyl peroxylaurate. Water-soluble initiators include inorganic initiators, for example, persulfate salts such as potassium persulfate, hydrogen peroxide, redox combinations of persulfate or hydrogen peroxide with a reducing agent such as sodium hydrogen sulfite or sodium thiosulfate, and systems in which any of the redox combinations and a minor amount of iron, ferrous salt or silver nitrate are co-present; and organic initiators, for example, dibasic acid compounds such as disuccinic peroxide, diglutaric peroxide and monosuccinic peroxide as well as azobisisobutylamidine dibasic acid salt. The amount of the polymerization initiator used is determined as appropriate in accordance with such factors as the identity of initiator and polymerization conditions, although the amount is often in the range of about 0.001 to 5% by weight, especially about 0.01 to 1% by weight based on the total weight of monomers to be polymerized.

For the polymerization reaction, a solvent may be used. The polymerization solvent used herein is preferably one which does not interfere with the polymerization reaction. Typical solvents include ester solvents such as ethyl acetate and n-butyl acetate, ketone solvents such as acetone, methyl ethyl ketone and methyl isobutyl ketone, aliphatic or aromatic hydrocarbon solvents such as toluene, xylene and cyclohexane, alcohol solvents such as isopropyl alcohol and ethylene glycol monomethyl ether, and ether solvents such as diethyl ether, dioxane, and tetrahydrofuran. These solvents may be used alone or in admixture of two or more.

Further, any of well-known molecular weight modifiers such as dodecylmercaptan may be used in the polymerization system. The temperature of polymerization reaction varies in accordance with the identity of polymerization initiator and the boiling point of the solvent although it is often preferably in the range of about 20 to 200° C., and especially about 50 to 140° C. Any desired reactor or vessel may be used for the polymerization reaction.

From the solution or dispersion of the polymer thus obtained, the organic solvent or water serving as the reaction medium is removed by any of well-known techniques. Suitable techniques include, for example, re-precipitation followed by filtration, and heat distillation under vacuum.

The polymer of the invention can be used as a base resin in resist compositions, specifically chemical amplification type resist compositions, and especially chemical amplification type positive working resist compositions.

It is understood that the polymer of the invention may be admixed with another polymer for the purpose of altering the dynamic properties, thermal properties, alkali solubility and other physical properties of polymer film. The type of the other polymer which can be admixed is not critical. Any of polymers known to be useful in resist use may be admixed in any desired proportion.

Resist Composition

As long as the polymer of the invention is used as a base resin, the resist composition of the invention may be prepared using well-known components. In a preferred embodiment, the chemically amplified positive resist composition is defined as comprising (A) the polymer (base resin) defined above, (B) an organic solvent, and (C) a photoacid generator. In the resist composition, there may be further formulated (D) a basic compound and/or (E) a dissolution inhibitor.

Component (B)

The organic solvent used as component (B) in the invention may be any organic solvent in which the base resin (inventive polymer), photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and aromatic solvents such as benzene, toluene and xylene.

Also useful are fluorinated organic solvents. Examples include 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 1,1,1,3,3,3-hexafluoroisopropyl alcohol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutaryl-methyl, ethyl 3-hydroxy-4,4,4-trifluorobutyrate, ethyl 2-methyl-4,4,4-trifluoroacetoacetate, ethyl pentafluoro-benzoate, ethyl pentafluoropropionate, ethyl pentafluoro-propynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluoro-nonanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro-2,5-dimethyl-3,6-dioxane anionic acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol-1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluoro (butyltetrahydrofuran), perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, and 1,1,1-trifluoro-5,5-dimethyl-2,4-hexanedione.

These solvents may be used alone or in combinations of two or more thereof. Of the above organic solvents, preferred are diethylene glycol dimethyl ether and 1-ethoxy-2-propanol, in which the photoacid generator is most soluble, and propylene glycol monomethyl ether acetate which is safe, and mixtures thereof.

Component (C)

Suitable examples of the photoacid generator (C) include onium salts of general formula (50) below, diazomethane derivatives of formula (51), glyoxime derivatives of formula (52), β-ketosulfone derivatives, disulfone derivatives, nitrobenzylsulfonate derivatives, sulfonic acid ester derivatives, and imidoyl sulfonate derivatives.

$$(R^{18})_n M^+ K^-$$ (50)

In the formula, $R^{18}$ is a straight, branched or cyclic alkyl of 1 to 12 carbon atoms, an aryl of 6 to 20 carbon atoms, or an aralkyl of 7 to 12 carbon atoms; $M^+$ is iodonium or sulfonium; $K^-$ is a non-nucleophilic counter-ion; and the letter n is 2 or 3.

Illustrative examples of alkyl groups represented by $R^{18}$ include methyl, ethyl, propyl, butyl, pentyl, 2-oxocyclopentyl, norbornyl, and adamantyl. Exemplary aryl groups include phenyl; alkoxyphenyl groups such as p-methoxyphenyl, m-methoxyphenyl, o-methoxyphenyl, ethoxy-phenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

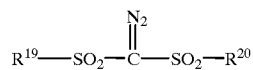

(51)

In the formula, $R^{19}$ and $R^{20}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{19}$ and $R^{20}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

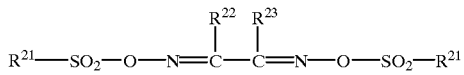

(52)

In the formula, $R^{21}$, $R^{22}$, and $R^{23}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{22}$ and $R^{23}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{21}$, $R^{22}$, and $R^{23}$ are exemplified by the same groups as mentioned above for $R^{19}$ and $R^{20}$. Examples of alkylene groups represented by $R^{22}$ and $R^{23}$ include methylene, ethylene, propylene, butylene, and hexylene.

Illustrative examples of the photoacid generator include: onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate; diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoro-methanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphor-sulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-O-(p-toluenesulfonyl)-α-dimethylglyoxime and bis-O-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves.

The combination of an onium salt with a diazomethane or a glyoxime derivative allows for fine adjustment of the profile.

The photoacid generator is preferably added in an amount of about 0.2 to 15 parts by weight per 100 parts by weight of the base resin. At less than 0.2 part, the amount of acid generated during exposure would be too small and the sensitivity and resolution be poor, whereas the addition of more than 15 parts would lower the transmittance of the resist and result in a poor resolution.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (53) and (54) may also be included.

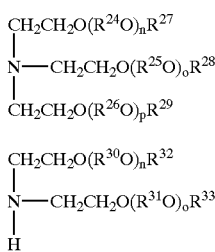

(53)

(54)

In the formulas, $R^{24}$, $R^{25}$, $R^{26}$, $R^{30}$ and $R^{31}$ are independently straight, branched or cyclic alkylenes of 1 to 20 carbon atoms; $R^{27}$, $R^{28}$, $R^{29}$, $R^{32}$ and $R^{33}$ are hydrogen, alkyls of 1 to 20 carbon atoms, or amino; $R^{27}$ and $R^{28}$, $R^{27}$ and $R^{29}$, $R^{28}$ and $R^{29}$, $R^{27}$ with $R^{28}$ and $R^{29}$, and $R^{32}$ and $R^{33}$ may bond together to form rings; and n, o and p are each integers from 0 to 20, with the proviso that hydrogen is excluded from $R^{24}$, $R^{25}$, $R^{26}$ $R^{30}$ and $R^{31}$ when n, o and p are equal to 0.

The alkylene groups represented by $R^{24}$, $R^{25}$, $R^{26}$, $R^{30}$ and $R^{31}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{27}$, $R^{28}$, $R^{29}$, $R^{32}$ and $R^{33}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{27}$ and $R^{28}$, $R^{27}$ and $R^{29}$, $R^{28}$ and $R^{29}$, $R^{27}$ with $R^{28}$ and $R^{29}$, and $R^{32}$ and $R^{33}$ form rings, the rings preferably have 1 to 20 carbon atoms, more preferably 1 to 8 carbon atoms, and most preferably 1 to 6 carbon atoms, and may have pendant alkyl groups of 1 to 6 carbon atoms, and especially 1 to 4 carbon atoms.

Subscripts n, o, and p are each integers from 0 to 20, preferably from 1 to 10, and more preferably from 1 to 8.

Illustrative examples of the compounds of formulas (53) and (54) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown-5.

The above-described basic compound may be used singly or in combinations of two or more thereof, and is preferably formulated in an amount of about 0.01 to 2 parts, and especially about 0.01 to 1 part by weight, per 100 parts by weight of the base resin. At less than 0.01 part, the desired effects of the basic compound would not be apparent, while the use of more than 2 parts would result in too low a resolution and sensitivity.

Component (E)

The dissolution inhibitor (E) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor. The acid labile groups may be either fluorinated ones contemplated herein or conventional fluorine-free ones.

Examples of the phenol or carboxylic acid derivative having a molecular weight of up to 2,500 include 4,4'-(1-methylethylidene)bisphenol, (1,1'-biphenyl-4,4'-diol)-2,2'-methylenebis(4-methylphenol), 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3'-difluoro[(1,1'-biphenyl)-4,4'-diol], 3,3',5,5'-tetrafluoro[(1,1'-biphenyl)-4,4'-diol], 4,4'-[2,2,2-trifluoro-1-(trifluoromethyl)ethylidene]bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylenebis(2,6-difluorophenol), 4,4'-(4-fluorophenyl)methylenebis(2,6-difluorophenol), 2,6-bis[(2-hydroxy-5-fluorophenyl)methyl]-4-fluorophenol, 2,6-bis[(4-hydroxy-3-fluorophenyl)methyl]-4-fluorophenol, and 2,4-bis[(3-hydroxy-4-hydroxyphenyl)methyl]-6-methylphenol. The acid labile substituents are the same as above formulae (2) to (4).

Illustrative, non-limiting, examples of the dissolution inhibitors which are useful herein include 3,3',5,5'-tetrafluoro[(1,1'-biphenyl)-4,4'-di-t-butoxycarbonyl], 4,4'-[2,2,2-trifluoro-1-(trifluoromethyl)ethylidene]bisphenol-4, 4'-di-t-butoxycarbonyl, bis(4-(2'-tetrahydropyranyloxy) phenyl)methane, bis(4-(2'-tetrahydrofuranyloxy)phenyl) methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy) phenyl)methane, 2,2-bis(4'-(2"-tetrahydropyranyloxy)) propane, 2,2-bis(4'-(2"-tetrahydrofuranyloxy)phenyl) propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis (4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy) phenyl)methane, 1,1,2-tris(4'-(2"-tetrahydropyranyloxy) phenyl)ethane, 1,1,2-tris(4'-(2"-tetrahydrofuranyloxy)

phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexanecarboxylate, t-butyl decahydronaphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition according to the invention, an appropriate amount of the dissolution inhibitor (E) is up to about 20 parts, and especially up to about 15 parts by weight per 100 parts by weight of the base resin in the composition. With more than 20 parts of the dissolution inhibitor, the resist composition becomes less heat resistant because of an increased content of monomer components.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, perfluoroalkyl EO-addition products, and fluorinated organosiloxane compounds. Illustrative examples include Florade FC-430 and FC-431 from Sumitomo 3M Ltd., Surflon S-141 and S-145 from Asahi Glass Co., Ltd., Unidyne DS-401, DS-403, and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays, excimer laser beams, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micro-pattern formation with, in particular, deep-UV rays having a wavelength of 254 to 120 nm, an excimer laser, especially ArF excimer laser (193 nm), F$_2$ excimer laser (157 nm), Kr$_2$ excimer laser (146 nm), KrAr excimer laser (134 nm) or Ar$_2$ excimer laser (126 nm), x-rays, or an electron beam, more preferably a wavelength band of 110 to 180 nm or 1 to 30 nm. The desired pattern may not be obtainable outside the upper and lower limits of the above range.

The resist composition comprising the polymer of the invention is sensitive to high-energy radiation, has excellent sensitivity and resolution at a wavelength of less than 200 nm, especially less than 170 nm, and significantly improved transmittance due to fluorine introduced into ester side chains. Because these features of the inventive resist composition enable its use particularly as a resist having a low absorption at the exposure wavelength of a F$_2$ excimer laser, a finely defined pattern having sidewalls perpendicular to the substrate can easily be formed, making the resist ideal as a micropatterning material in VLSI fabrication.

EXAMPLE

Examples of the invention are given below by way of illustration and not by way of limitation. The abbreviations used herein are LPO for lauroyl peroxide, GPC for gel permeation chromatography, NMR for nuclear magnetic resonance, Mw for weight average molecular weight, and Mn for number average molecular weight.

Synthesis Example 1

Copolymerization of 2,2,2-trifluoroethyl Methacrylate, 2-ethyladamantyl Methacrylate and Monomer 1 (0.4/0.4/0.2)

In a 1-liter flask, 6.2 g of 2,2,2-trifluoroethyl methacrylate, 9.2 g of 2-ethyladamantyl methacrylate and 4.6 g of Monomer 1 shown below were admitted and dissolved in 300 ml of toluene. The system was fully purged of oxygen, 1.36 g of the initiator LPO was added, and the system was heated at 60° C. at which polymerization reaction took place for 24 hours.

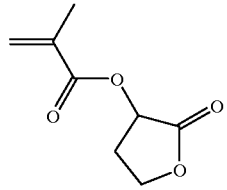

Monomer 1

The polymer thus obtained was purified by pouring the reaction mixture into methanol whereupon the polymer precipitated. The polymer collected was dissolved in tetrahydrofuran and poured into 10 liters of methanol for precipitation. This procedure was repeated twice. The polymer was separated and dried. There was obtained 15.2 g of a white polymer, which was found to have a Mw of 9,100 as measured by the light scattering method, and a dispersity (Mw/Mn) of 1.5 as determined from the GPC elution curve. On $^1$H-NMR analysis, the polymer was found to consist of 2,2,2-trifluoroethyl methacrylate, 2-ethyladamantyl methacrylate and Monomer 1 in a ratio of 0.40:0.33:0.27.

Synthesis Example 2

Copolymerization of 1,1,1,3,3,3-hexafluoroisopropyl Methacrylate, 2-ethyladamantyl Methacrylate and Monomer 1 (0.4/0.3/0.3)

In a 1-liter flask, 8.3 g of 1,1,1,3,3,3-hexafluoroisopropyl methacrylate, 8.7 g of 2-ethyladamantyl methacrylate and 3.0 g of Monomer 1 were admitted and dissolved in 300 ml of toluene. The system was fully purged of oxygen, 1.4 g of the initiator LPO was added, and the system was heated at 60° C. at which polymerization reaction took place for 24 hours.

The polymer thus obtained was purified by pouring the reaction mixture into methanol whereupon the polymer precipitated. The polymer collected was dissolved in tetrahydrofuran and poured into 10 liters of methanol for precipitation. This procedure was repeated twice. The polymer was separated and dried. There was obtained 13.2 g of a white polymer, which was found to have a Mw of 13,000 as measured by the light scattering method, and a dispersity (Mw/Mn) of 1.4 as determined from the GPC elution curve. On $^1$H-NMR analysis, the polymer was found to consist of 1,1,1,3,3,3-hexafluoroisopropyl methacrylate, 2-ethyladamantyl methacrylate and Monomer 1 in a ratio of 0.41:0.20:0.39.

Synthesis Example 3

Copolymerization of 2,2,2-trifluoroethyl Methacrylate, 1-ethylcyclopentyl Methacrylate and Monomer 1 (0.4/0.4/0.2)

In a 1-liter flask, 7.7 g of 2,2,2-trifluoroethyl methacrylate, 8.4 g of 1-ethylcyclopentyl methacrylate and 3.9 g of Monomer 1 were admitted and dissolved in 300 ml of toluene. The system was fully purged of oxygen, 1.8 g of the initiator LPO was added, and the system was heated at 60° C. at which polymerization reaction took place for 24 hours.

The polymer thus obtained was purified by pouring the reaction mixture into methanol whereupon the polymer precipitated. The polymer collected was dissolved in tetrahydrofuran and poured into 10 liters of methanol for precipitation. This procedure was repeated twice. The polymer was separated and dried. There was obtained 13.9 g of a white polymer, which was found to have a Mw of 11,000 as measured by the light scattering method, and a dispersity (Mw/Mn) of 1.5 as determined from the GPC elution curve. On $^1$H-NMR analysis, the polymer was found to consist of 2,2,2-trifluoroethyl methacrylate, 1-ethylcyclopentyl methacrylate and Monomer 1 in a ratio of 0.41:0.35:0.24.

Synthesis Example 4

Copolymerization of 1,1,1,3,3,3-hexafluoroisopropyl Methacrylate, 1-ethylcyclopentyl Methacrylate and Monomer 1 (0.4/0.3/0.3)

In a 1-liter flask, 9.5 g of 1,1,1,3,3,3-hexafluoroisopropyl methacrylate, 5.5 g of 1-ethylcyclopentyl methacrylate and 5.0 g of Monomer 1 were admitted and dissolved in 300 ml of toluene. The system was fully purged of oxygen, 1.6 g of the initiator LPO was added, and the system was heated at 60° C. at which polymerization reaction took place for 24 hours.

The polymer thus obtained was purified by pouring the reaction mixture into methanol whereupon the polymer precipitated. The polymer collected was dissolved in tetrahydrofuran and poured into 10 liters of methanol for precipitation. This procedure was repeated twice. The polymer was separated and dried. There was obtained 14.2 g of a white polymer, which was found to have a Mw of 12,000 as measured by the light scattering method, and a dispersity (Mw/Mn) of 1.5 as determined from the GPC elution curve. On $^1$H-NMR analysis, the polymer was found to consist of 1,1,1,3,3,3-hexafluoroisopropyl methacrylate, 1-ethylcyclopentyl methacrylate and Monomer 1 in a ratio of 0.40:0.25:0.35.

Synthesis Example 5

Copolymerization of 2,2,2-trifluoroethyl α-trifluoromethylarylate, 2-ethyladamantyl Methacrylate and Monomer 1 (0.4/0.4/0.2)

In a 1-liter flask, 16.0 g of 2,2,2-trifluoroethyl α-trifluoromethylarylate, 12.7 g of 2-ethyladamantyl methacrylate and 3.1 g of Monomer 1 were admitted and dissolved in 300 ml of toluene. The system was fully purged of oxygen, 1.07 g of the initiator LPO was added, and the system was heated at 60° C. at which polymerization reaction took place for 24 hours.

The polymer thus obtained was purified by pouring the reaction mixture into methanol whereupon the polymer precipitated. The polymer collected was dissolved in tetrahydrofuran and poured into 10 liters of methanol for precipitation. This procedure was repeated twice. The polymer was separated and dried. There was obtained 14.2 g of a white polymer, which was found to have a Mw of 9,500 as measured by the light scattering method, and a dispersity (Mw/Mn) of 1.5 as determined from the GPC elution curve. On $^1$H-NMR analysis, the polymer was found to consist of 2,2,2-trifluoroethyl α-trifluoromethylarylate, 2-ethyladamantyl methacrylate and Monomer 1 in a ratio of 0.37:0.38:0.25.

Synthesis Example 6

Copolymerization of 2,2,2-trifluoroethyl Methacrylate, 2-ethyladamantyl Methacrylate and 2-hydroxyethyl Methacrylate (0.4/0.4/0.2)

In a 1-liter flask, 7.0 g of 2,2,2-trifluoroethyl methacrylate, 10.3 g of 2-ethyladamantyl methacrylate and 2.7 g of 2-hydroxyethyl methacrylate were admitted and dissolved in 300 ml of toluene. The system was fully purged of oxygen, 1.24 g of the initiator LPO was added, and the system was heated at 60° C. at which polymerization reaction took place for 24 hours.

The polymer thus obtained was purified by pouring the reaction mixture into methanol whereupon the polymer precipitated. The polymer collected was dissolved in tetrahydrofuran and poured into 10 liters of methanol for precipitation. This procedure was repeated twice. The polymer was separated and dried. There was obtained 13.5 g of a white polymer, which was found to have a Mw of 13,000 as measured by the light scattering method, and a dispersity (Mw/Mn) of 1.6 as determined from the GPC elution curve. On $^1$H-NMR analysis, the polymer was found to consist of 2,2,2-trifluoroethyl methacrylate, 2-ethyladamantyl methacrylate and 2-hydroxyethyl methacrylate in a ratio of 0.41:0.38:0.21.

Synthesis Example 7

Copolymerization of 2,2,2-trifluoroethyl methacrylate, 2-ethyladamantyl methacrylate and Monomer 2 (0.4/0.4/0.2)

In a 1-liter flask, 6.4 g of 2,2,2-trifluoroethyl methacrylate, 9.4 g of 2-ethyladamantyl methacrylate and 4.2 g of Monomer 2 were admitted and dissolved in 300 ml of toluene. The system was fully purged of oxygen, 1.13 g of the initiator LPO was added, and the system was heated at 60° C. at which polymerization reaction took place for 24 hours.

The polymer thus obtained was purified by pouring the reaction mixture into methanol whereupon the polymer precipitated. The polymer collected was dissolved in tetrahydrofuran and poured into 10 liters of methanol for precipitation. This procedure was repeated twice. The polymer was separated and dried. There was obtained 13.9 g of a white polymer, which was found to have a Mw of 9,700 as measured by the light scattering method, and a dispersity (Mw/Mn) of 1.5 as determined from the GPC elution curve. On $^1$H-NMR analysis, the polymer was found to consist of 2,2,2-trifluoroethyl methacrylate, 2-ethyladamantyl methacrylate and Monomer 2 in a ratio of 0.45:0.35:0.20.

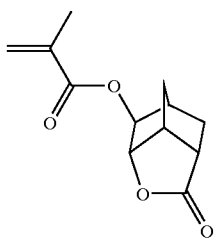

Monomer 2

Comparative Synthesis Example 1

Copolymerization of 2-ethyladamantyl Methacrylate and Monomer 1 (0.5/0.5)

In a 1-liter flask, 12.8 g of 2-ethyladamantyl methacrylate and 7.2 g of Monomer 1 were admitted and dissolved in 300 ml of toluene. The system was fully purged of oxygen, 1.5 g of the initiator LPO was added, and the system was heated at 60° C. at which polymerization reaction took place for 24 hours.

The polymer thus obtained was purified by pouring the reaction mixture into methanol whereupon the polymer precipitated. The polymer collected was dissolved in tetrahydrofuran and poured into 10 liters of methanol for precipitation. This procedure was repeated twice. The polymer was separated and dried. There was obtained 13.2 g of a white polymer, which was found to have a Mw of 11,000 as measured by the light scattering method, and a dispersity (Mw/Mn) of 1.4 as determined from the GPC elution curve. On $^1$H-NMR analysis, the polymer was found to consist of 2-ethyladamantyl methacrylate and Monomer 1 in a ratio of 0.49:0.51.

The polymers obtained in Synthesis Examples 1 to 7 and Comparative Synthesis Example 1 are designated Polymers 1 to 8, respectively. They were determined for transmittance.

Polymer Transmittance Measurement

Each polymer, 1 g, was thoroughly dissolved in 10 g of propylene glycol monomethyl ether acetate (PGMEA), and passed through a 0.2-μm filter, obtaining a polymer solution.

The polymer solution was spin coated onto a MgF$_2$ substrate and baked on a hot plate at 100° C. for 90 seconds, forming a polymer layer of 200 nm thick on the MgF$_2$ substrate. Using a vacuum ultraviolet spectrometer (VUV200S by Nihon Bunko K.K.), the polymer layer was measured for transmittance at 248 nm, 193 nm and 157 nm. The results are shown in Table 1.

TABLE 1

| | Transmittance (%) | | |
|---|---|---|---|
| | 248 nm | 193 nm | 157 nm |
| Polymer 1 | 92 | 85 | 32 |
| Polymer 2 | 92 | 86 | 35 |
| Polymer 3 | 92 | 84 | 36 |
| Polymer 4 | 93 | 86 | 25 |
| Polymer 5 | 97 | 92 | 45 |
| Polymer 6 | 93 | 88 | 39 |
| Polymer 7 | 91 | 85 | 35 |
| Polymer 8 | 85 | 75 | 8 |

Using the above polymers, chemically amplified positive resist compositions were prepared as follows.

Preparation of Resist Compositions

Resist solutions were prepared in a conventional manner by formulating the polymer, photoacid generator (PAG1 or PAG2), basic compound, dissolution inhibitor (DRI1) and solvent in the amounts shown in Table 2.

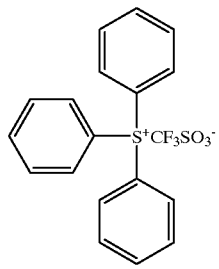

PAG 1

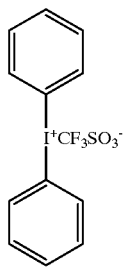

PAG 2

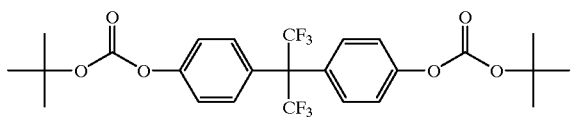

DRI 1

TBA: tributylamine
PGMEA: propylene glycol monomethyl ether acetate

On silicon wafers having a film of DUV-30 (Brewer Science Co.,) coated to a thickness of 80 nm thick, the resist solutions were spin coated, then baked on a hot plate at 100° C. for 90 seconds to give resist films having a thickness of 200 nm.

Figure 2:
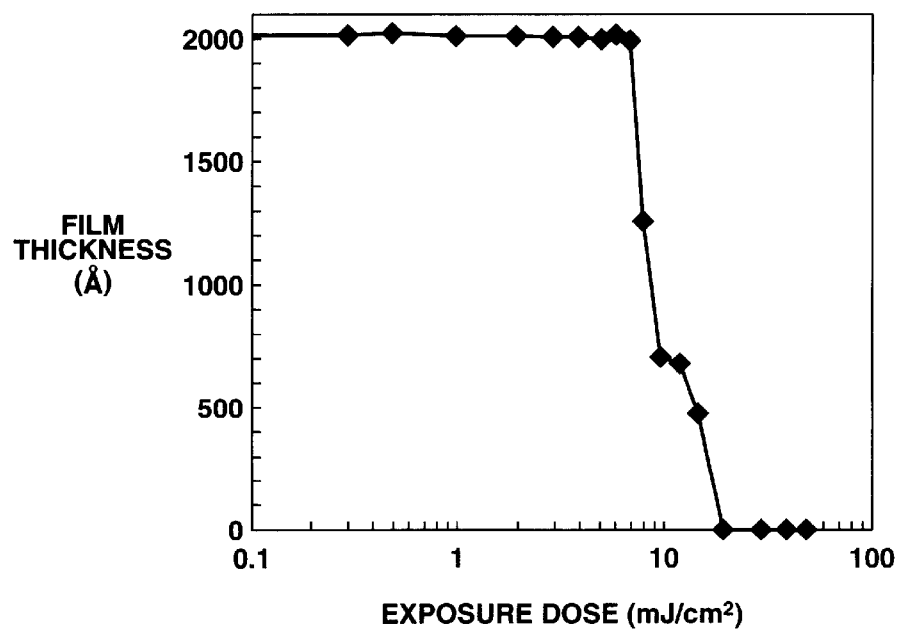
FIG. 2 is a graph showing film thickness versus exposure dose for the resist composition of Comparative Example 1.

The resist films were exposed by means of an F$_2$ excimer laser (VUV ES-4500 Lithotec Japan Co., Ltd.) while varying the exposure dose. Immediately after exposure, the resist films were baked at 120° C. for 90 seconds and then developed for 60 seconds with a 2.38% aqueous solution of tetramethylammonium hydroxide. The film thickness was measured in different dose areas. From the residual film thickness-to-dose relationship, the sensitivity (Eth) giving a film thickness 0 was determined. A gamma value which was the slope of the characteristic curve was also determined. The sensitivity curves of Example 4 and Comparative Example 1 are shown in FIGS. 1 and 2 for ease of comparison.

TABLE 2

| | Polymer (pbw) | Photoacid generator (pbw) | Basic compound (pbw) | Dissolution inhibitor (pbw) | Solvent (pbw) | Eth (mJ/cm$^2$) | γ value |
|---|---|---|---|---|---|---|---|
| E1 | Polymer 1 (100) | PAG1 (2) | TBA (0.1) | — | PGMEA (1000) | 18 | 30 |
| E2 | Polymer 2 (100) | PAG1 (2) | TBA (0.1) | — | PGMEA (1000) | 18 | 30 |
| E3 | Polymer 3 (100) | PAG1 (2) | TBA (0.1) | — | PGMEA (1000) | 19 | 25 |
| E4 | Polymer 4 (100) | PAG1 (2) | TBA (0.1) | — | PGMEA (1000) | 10 | 40 |
| E5 | Polymer 5 (100) | PAG1 (2) | TBA (0.1) | — | PGMEA (1000) | 15 | 20 |
| E6 | Polymer 6 (100) | PAG1 (2) | TBA (0.1) | — | PGMEA (1000) | 16 | 42 |
| E7 | Polymer 7 (100) | PAG1 (2) | TBA (0.1) | — | PGMEA (1000) | 25 | 33 |
| E8 | Polymer 1 (100) | PAG2 (2) | TBA (0.1) | — | PGMEA (1000) | 14 | 30 |
| E9 | Polymer 1 (100) | PAG1 (2) | TBA (0.1) | DRI1 (20) | PGMEA (1000) | 16 | 32 |
| CE1 | Polymer 8 (100) | PAG1 (2) | TBA (0.1) | — | PGMEA (1000) | 20 | 7 |

PGMEA: propylene glycol monomethyl ether acetate

As is evident from Tables 1 and 2 and FIGS. 1 and 2, resist compositions using polymers within the scope of the invention satisfy a high transparency, contrast and sensitivity at a wavelength in proximity to the F$_2$ excimer laser (157 nm).

Japanese Patent Application No. 2000-271205 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer comprising recurring units of formula (1):

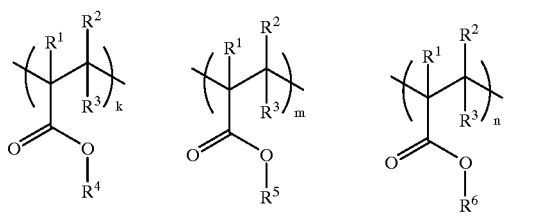

(1)

wherein, R$^1$ to R$^3$ are, each independently, hydrogen, fluorine, a straight, branched or cyclic alkyl or a fluorinated alkyl group of 1 to 20 carbon atoms, R$^4$ is a monovalent fluorinated hydrocarbon group of 1 to 20 carbon atoms containing at least one fluorine atom, R$^5$ is an acid labile group, R$^6$ is an adhesive group, subscripts k, m and n are numbers satisfying 0<k+m+n≦1 and at least one of the units containing R$^4$ to R$^6$ has an alicyclic structure.

2. The polymer of claim 1 wherein in formula (1), R$^5$ has at least one alicyclic structure.

3. The polymer of claim 1, wherein in formula (1), R$^1$ is a methyl group or trifluoromethyl group.

4. The polymer of claim 1 wherein in formula (1), R$^4$ has 3 to 9 fluorine atoms.

5. A resist composition comprising the polymer of claim 1.

6. A chemically amplified, positive resist composition comprising (A) the polymer of claim 1, (B) an organic solvent, and (C) a photoacid generator.

7. The resist composition of claim 6 further comprising (D) a basic compound.

8. The resist composition of claim 6 further comprising (E) a dissolution inhibitor.

9. A process for forming a resist pattern comprising the steps of:

applying the resist composition of claim 6, onto a substrate to form a coating, heat treating the coating and then exposing it to high-energy radiation in a wavelength band of 110 to 180 nm or 1 to 30 nm through a photo mask, and optionally heat treating the exposed coating and developing it with a developer.

10. The polymer of claim 1 wherein in formula (1) k is about 0.05 to 0.7, m is about 0.1 to 0.7, and n is about 0.01 to 0.5.

11. The polymer of claim 1 wherein in formula (1) k is about 0.1 to 0.6, m is about 0.1 to 0.5, and n is about 0.01 to 0.5.

12. The polymer of claim 1 wherein in formula (1) k+m+n=1.

13. The polymer of claim 1 wherein in formula (1) R$^1$ to R$^3$ have 1 to 10 carbon atoms.

14. The polymer of claim 11 wherein the acid labile group of R$^5$ is of formula (2), (3) or (4),

(2)

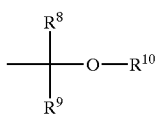
(3)

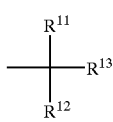
(4)

wherein, $R^7$ and $R^{10}$ are, each independently, a monovalent hydrocarbon group of 1 to 20 carbon atoms, $R^8$ and $R^9$ are, each independently, hydrogen or a straight, branched or cyclic alkyl group of 1 to 20 carbon atoms, $R^{11}$ to $R^{13}$ are, each independently, a monovalent hydrocarbon group of 1 to 20 carbon atoms in which 1 or more hydrogen atoms are optionally substituted with fluorine atoms, a is an integer of 0 to 10, $R^7$ to $R^{13}$ optionally contain hetero atoms, and wherein $R^8$ and $R^9$, $R^8$ and $R^{10}$, $R^9$ and $R^{10}$, $R^{11}$ and $R^{12}$, $R^{11}$ and $R^{13}$, or $R^{12}$ and $R^{13}$, taken together, optionally form a ring.

15. The polymer of claim 1 wherein the adhesive group of $R^6$ is a compound selected from the group consisting of compounds of formulae (21) through (49),

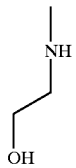
(21)

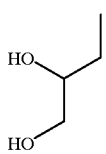
(22)

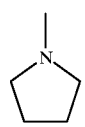
(23)

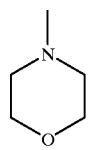
(24)

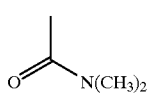
(25)

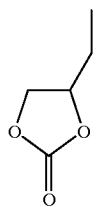
(26)

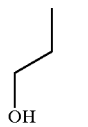
(27)

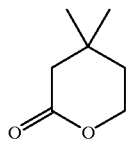
(28)

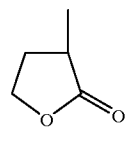
(29)

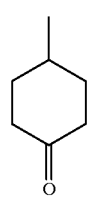
(30)

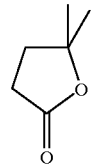
(31)

(32)

(33)

(34)

(35) 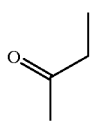
(36) 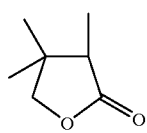
(37) 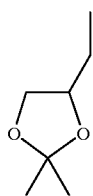
(38) 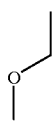
(39) 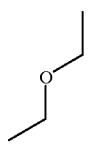
(40) 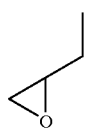
(41) 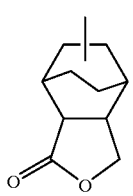
(42) 
(43) 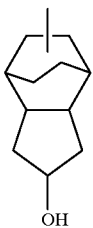
(44) 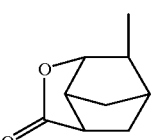
(45) 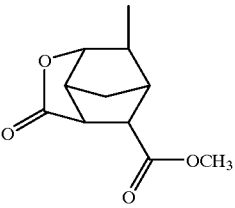
(46) 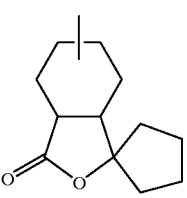
(47) 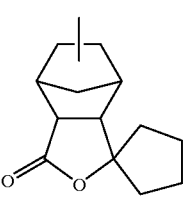
(48) 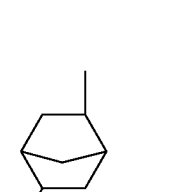
(49) 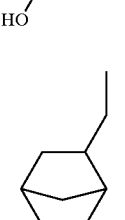

16. A chemically amplified, positive resist composition comprising
(A) the polymer of claim 14,
(B) an organic solvent, and
(C) a photoacid generator.

17. A chemically amplified, positive resist composition comprising
(A) the polymer of claim 15,
(B) an organic solvent, and
(C) a photoacid generator.

18. A process for forming a resist pattern comprising the steps of:

applying the resist composition of claim 6 onto a substrate to form a coating, heat treating the coating and then exposing it to high-energy radiation in a wavelength band of 110 to 180 nm or 1 to 30 nm through a photo mask, and optionally heat treating the exposed coating and developing it with a developer.

19. The pattern forming process of claim 18 wherein the high-energy radiation is an $F_2$ excimer laser beam, $Ar_2$ excimer laser beam or soft x-ray.

20. The pattern forming process of claim 18, wherein the high-energy radiation is an $F_2$ excimer laser beam, $Ar_2$ excimer laser beam or soft x-ray.

\* \* \* \* \*